(12) United States Patent
Yoshikawa et al.

(10) Patent No.: US 6,794,199 B2
(45) Date of Patent: Sep. 21, 2004

(54) FERROELECTRIC MEMORY AND METHOD FOR FABRICATING THE SAME

(75) Inventors: Takafumi Yoshikawa, Niigata (JP); Takumi Mikawa, Shiga (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/750,862

(22) Filed: Jan. 5, 2004

(65) Prior Publication Data

US 2004/0140493 A1 Jul. 22, 2004

Related U.S. Application Data

(62) Division of application No. 10/253,524, filed on Sep. 25, 2002, now Pat. No. 6,717,198.

(30) Foreign Application Priority Data

Sep. 27, 2001 (JP) ........................................ 2001-296855

(51) Int. Cl.[7] .............................................. H01L 21/00
(52) U.S. Cl. ........................... 438/3; 438/240; 438/238; 438/244; 257/68; 257/71; 257/295; 257/296; 257/303; 257/306
(58) Field of Search ...................... 438/3, 240; 257/68, 257/71, 295–314, 324–326

(56) References Cited

U.S. PATENT DOCUMENTS

| 6,180,971 B1 | 1/2001 | Maejima |
| 6,188,098 B1 * | 2/2001 | Amanuma ................... 257/306 |
| 6,441,420 B1 | 8/2002 | Nagano et al. |
| 6,455,327 B1 * | 9/2002 | Maejima ......................... 438/3 |
| 6,611,014 B1 | 8/2003 | Kanaya et al. |
| 2001/0006239 A1 | 7/2001 | Yang et al. |
| 2001/0006241 A1 | 7/2001 | Yang |

FOREIGN PATENT DOCUMENTS

| JP | 11-135736 A | 5/1999 |
| JP | 11-163288 A | 6/1999 |

* cited by examiner

Primary Examiner—David Nelms
Assistant Examiner—Andy Huynh
(74) Attorney, Agent, or Firm—McDermott Will & Emery LLP

(57) ABSTRACT

A first insulating hydrogen barrier film is filled between lower electrodes of some ferroelectric capacitors arranged along one direction out of a word line direction and a bit line direction among a plurality of ferroelectric capacitors included in a ferroelectric memory of this invention. A common capacitor dielectric film commonly used by the some ferroelectric capacitors arranged along the one direction is formed on the lower electrodes of the some ferroelectric capacitors arranged along the one direction and on the first insulating hydrogen barrier film. A common upper electrode commonly used by the some ferroelectric capacitors arranged along the one direction is formed on the common capacitor dielectric film. A second insulating hydrogen barrier film is formed so as to cover the common upper electrode.

9 Claims, 6 Drawing Sheets

FERROELECTRIC MEMORY AND METHOD FOR FABRICATING THE SAME

This application is a divisional of application Ser. No. 10/253,524 filed Sep. 25, 2002 now U.S. Pat. No. 6,717,198.

BACKGROUND OF THE INVENTION

The present invention relates to a ferroelectric memory including a plurality of ferroelectric capacitors, each of which has a lower electrode, a capacitor dielectric film of a ferroelectric film and an upper electrode formed successively on a semiconductor substrate, arranged in a matrix shape along a word line direction and a bit line direction, and a method for fabricating the ferroelectric memory.

Recently, a nonvolatile ferroelectric memory including a capacitor dielectric film made from a ferroelectric material having a hysteresis characteristic, such as $SrBi_2Ta_2O_9$ (hereinafter referred to as SBT) or $Pb(Zr, Ti)O_3$ (hereinafter referred to as PZT), has been developed. The ferroelectric material such as SBT or PZT used in this ferroelectric memory is a ferroelectric oxide.

Therefore, the ferroelectric oxide is reduced if it is exposed to a reducing atmosphere or a hydrogen atmosphere in particular during annealing performed in an atmosphere including hydrogen for securing the characteristic of a MOS transistor formed on a semiconductor substrate after forming aluminum wires above a plurality of ferroelectric capacitors with an interlayer insulating film sandwiched therebetween or during CVD performed for filling a tungsten film in a contact hole with an aspect ratio sufficiently high for reducing the size of the semiconductor memory. As a result of the reduction, the crystal composition of the ferroelectric oxide is broken, so that the insulating property of the capacitor dielectric film or the characteristic of the ferroelectric oxide can be largely degraded.

Accordingly, in order to prevent the capacitor dielectric film of the ferroelectric capacitor from being reduced through the exposure to hydrogen even when the ferroelectric capacitor is subjected to annealing performed in a hydrogen atmosphere after forming it, a hydrogen barrier film for preventing hydrogen from invading the capacitor dielectric film is formed over the ferroelectric capacitor.

In the case where the hydrogen barrier film is formed between the ferroelectric capacitor and an interlayer insulating film formed thereon, the area of the hydrogen barrier film should be larger than that of the ferroelectric capacitor by at least several $\mu$ m for preventing the hydrogen from invading in a horizontal direction. Also, since the hydrogen barrier film is formed also on a contact plug buried in the interlayer insulating film, if the contact plug is made from a tungsten film formed by the CVD, the effect of the hydrogen barrier film to prevent the hydrogen invasion of the capacitor dielectric film is lowered.

In particular, the area of the ferroelectric capacitor has recently been reduced (to 1 $\mu$ m$^2$ or less) due to the size reduction of the ferroelectric memory, and for the above-described reason, the hydrogen invasion of the capacitor dielectric film cannot be definitely prevented merely by covering the ferroelectric capacitor with the hydrogen barrier film.

As a countermeasure, Japanese Laid-Open Patent Publication No. 11-135736 has proposed a ferroelectric memory having a structure as shown in FIG. 6.

Now, the ferroelectric memory of FIG. 6 will be described as a conventional example.

An isolation region 11 and impurity diffusion layers 12 serving as a source and a drain are formed in surface portions of a silicon substrate 10. A gate electrode 13 is formed on the silicon substrate 10 with a gate insulating film sandwiched therebetween in a portion between the impurity diffusion layers 12. The gate electrode 13 and the impurity diffusion layers 12 together form a field effect transistor.

A first interlayer insulating film 14 is formed on the field effect transistor and the isolation region 11, and a first insulating hydrogen barrier film 15 is formed on the first interlayer insulating film 14 above the isolation region 11. A ferroelectric capacitor including a lower electrode 16, a capacitor dielectric film 17 of a ferroelectric film and an upper electrode 18 is formed on the first insulating hydrogen barrier film 15. A conducting hydrogen barrier film 19 is formed on the upper electrode 18, and a second insulating hydrogen barrier film 20 is formed on the top face of the conducting hydrogen barrier film 19 and the side faces of the lower electrode 16, the capacitor dielectric film 17 and the upper electrode 18. Thus, the ferroelectric capacitor is completely covered with the first insulating hydrogen barrier film 15, the conducting hydrogen barrier film 19 and the second insulating hydrogen barrier film 20.

A second interlayer insulating film 21 is formed on the first interlayer insulating film 14 and the second insulating hydrogen barrier film 20. A metal wire 22 is formed on the second interlayer insulating film 21, and the metal wire 22 is connected to a contact plug 23 buried in the first interlayer insulating film 14 and the second interlayer insulating film 21.

Since the ferroelectric capacitor is completely covered with the first insulating hydrogen barrier film 15, the conducting hydrogen barrier film 19 and the second insulating hydrogen barrier film 20 as described above, the hydrogen invasion of the capacitor dielectric film 17 can be prevented.

In this conventional ferroelectric memory, however, a side portion of the second insulating hydrogen barrier film 20 may disappear or be reduced in its thickness due to mask shift occurring in patterning the second insulating hydrogen barrier film 20.

Therefore, it is necessary to increase the thickness of the second insulating hydrogen barrier film 20 and to increase the margin of a mask used for pattering the second insulating hydrogen barrier film 20.

As a result, it is necessary to increase the intervals between ferroelectric capacitors, which disadvantageously makes it difficult to reduce the size of the ferroelectric memory.

SUMMARY OF THE INVENTION

In consideration of the aforementioned conventional problem, an object of the invention is definitely preventing hydrogen from invading a capacitor dielectric film of a ferroelectric capacitor as well as reducing the size of a ferroelectric memory.

In order to achieve the object, the ferroelectric memory of this invention comprises a plurality of ferroelectric capacitors, each of which includes a lower electrode, a capacitor dielectric film of a ferroelectric film and an upper electrode successively formed on an interlayer insulating film on a semiconductor substrate, the plurality of ferroelectric capacitors being arranged along a word line direction and a bit line direction, a first insulating hydrogen barrier film is filled between the lower electrodes of some ferroelectric capacitors, among the plurality of ferroelectric capacitors, that are arranged along one direction out of the word line direction and the bit line direction, the capacitor dielectric film is formed as a common capacitor dielectric film commonly used by the some ferroelectric capacitors arranged along the one direction and formed on the lower electrodes of the some ferroelectric capacitors arranged along the one direction and on the first insulating hydrogen barrier film, the upper electrode is formed as a common upper electrode commonly used by the some ferroelectric capacitors arranged along the one direction and formed on the common capacitor dielectric film, and a second insulating hydrogen barrier film is formed to cover the common upper electrode.

In the ferroelectric memory of this invention, the first insulating hydrogen barrier film is filled between the lower electrodes of the plural ferroelectric capacitors arranged in one direction out of the word line direction and the bit line direction. Therefore, there is no need to pattern the first insulating hydrogen barrier film in regions between the lower electrodes of the ferroelectric capacitors arranged in the one direction, and hence, there is no need to secure a dimensional margin between the lower electrodes in consideration of shift of a mask used for patterning. As a result, the intervals between the ferroelectric capacitors can be reduced, so as to reduce the area of the memory cell, namely, the area of the ferroelectric memory.

Also, since the second insulating hydrogen barrier film is formed so as to cover the common upper electrode, even when annealing in a hydrogen atmosphere is performed after forming the ferroelectric capacitors, hydrogen invasion of the capacitor dielectric film of the ferroelectric capacitor in a downward direction can be prevented. Thus, the ferroelectric film used for forming the capacitor dielectric film can be prevented from being reduced.

In the ferroelectric memory, the second insulating hydrogen barrier film is preferably formed separately with respect to every capacitor line including some ferroelectric capacitors arranged along the one direction.

Thus, there is also no need to pattern the second insulating hydrogen barrier film in a region between the lower electrodes of the plural ferroelectric capacitors arranged in the one direction, and hence, there is no need to secure a dimensional margin between the lower electrodes in consideration of the shift of a mask used for patterning. Accordingly, the intervals between the ferroelectric capacitors can be reduced, so as to reduce the area of the memory cell, namely, the area of the ferroelectric memory.

In the ferroelectric memory, the second insulating hydrogen barrier film is preferably formed to cover a pair of capacitor lines adjacent to each other along the other direction out of the word line direction and the bit line direction among capacitor lines each including some ferroelectric capacitors arranged along the one direction.

Thus, there is no need to secure a dimensional margin between the pair of capacitor lines each including the plural ferroelectric capacitors arranged in the one direction. Therefore, the interval between the pair of capacitor lines can be reduced, so as to reduce the area of the memory cell array, namely, the area of the ferroelectric memory. Also, since there is a region where no hydrogen barrier film is formed in the vicinity of a selecting transistor of the ferroelectric memory, it is possible to secure a path for hydrogen to diffuse into the selecting transistor during annealing performed in a hydrogen atmosphere for recovering the characteristic of the transistor after forming metal wires.

In the ferroelectric memory, a conducting hydrogen barrier film is preferably. formed between a contact plug formed in the interlayer insulating film and the lower electrodes.

Thus, in the case where annealing in a hydrogen atmosphere is performed after forming the ferroelectric capacitors, hydrogen invasion of the capacitor dielectric film of the ferroelectric capacitors in an upward direction can be prevented. Therefore, the ferroelectric film used for forming the capacitor dielectric film can be prevented from being reduced.

In the case where the ferroelectric memory of this invention includes the conducting hydrogen barrier film, every capacitor line including some ferroelectric capacitors arranged along the one direction is preferably completely covered with the conducting hydrogen barrier film, the first insulating hydrogen barrier film and the second insulating hydrogen barrier film.

Thus, even when annealing is performed in a hydrogen atmosphere after forming the ferroelectric capacitors, the hydrogen invasion of the capacitor dielectric film of the ferroelectric capacitors can be definitely prevented. Accordingly, the ferroelectric film used for forming the capacitor dielectric film can be prevented from being reduced, resulting in definitely preventing degradation of the characteristic of the capacitor dielectric film.

In the ferroelectric memory, a level reducing film for reducing a level difference caused in a peripheral portion of the common upper electrode is preferably formed between the common upper electrode and the second insulating hydrogen barrier film.

Thus, an angular level difference caused in the peripheral portion of the patterned upper electrode can be reduced, so as to improve coverage of the second insulating hydrogen barrier film at the peripheral portion of the upper electrode.

In the ferroelectric memory, the first insulating hydrogen barrier film can be made from a $Si_3N_4$ film, a SiON film, an $Al_2O_3$ film, a $TiO_2$ film or an oxide or oxide nitrided film of an alloy of Ti and Al.

In the ferroelectric memory, the second insulating hydrogen barrier film can be made from a $Si_3N_4$ film, a SiON film, an $Al_2O_3$ film, a $TiO_2$ film, a TiN film, an alloy film of Ti and Al, or an oxide, nitride or oxide nitrided film of an alloy of Ti and Al.

In the ferroelectric memory, the conducting hydrogen barrier film can be made from an alloy film of Ti and Al, a nitride or oxide nitrided film of an alloy of Ti and Al, or a TiN film.

The method of this invention for fabricating a ferroelectric memory including a plurality of ferroelectric capacitors, each of which has a lower electrode, a capacitor dielectric film of a ferroelectric film and an upper electrode successively formed on an interlayer insulating film on a semiconductor substrate, the plurality of ferroelectric capacitors being arranged along a bit line direction and a word line direction, comprises the steps of forming the lower electrodes of the plurality of ferroelectric capacitors on the interlayer insulating film; depositing a first insulating hydrogen barrier film on the interlayer insulating film and the lower electrodes and planarizing the first insulating hydrogen barrier film, whereby filling the first insulating hydrogen barrier film between the lower electrodes of some ferroelectric capacitors, among the plurality of ferroelectric capacitors, that are arranged along one direction out of the word line direction and the bit line direction; forming, on the lower electrodes of the some ferroelectric capacitors arranged along the one direction and on the first insulating hydrogen barrier film, the capacitor dielectric film as a common capacitor dielectric film commonly used by the some ferroelectric capacitors arranged along the one direction; forming, on the common capacitor dielectric film, the upper electrode as a common upper electrode commonly used by the some ferroelectric capacitors arranged along the one direction; and forming, on the common upper electrode, a second insulating hydrogen barrier film covering the common upper electrode.

In the method for fabricating a ferroelectric memory of this invention, the first insulating hydrogen barrier film is filled between the lower electrodes of the plural ferroelectric capacitors arranged in one direction. Therefore, there is no need to pattern the first insulating hydrogen barrier film in regions between the lower electrodes of the ferroelectric capacitors arranged in the one direction, and hence, there is no need to secure a dimensional margin between the lower electrodes in consideration of shift of a mask used for patterning. As a result, the intervals between the ferroelectric capacitors can be reduced, so as to reduce the area of the memory cell, namely, the area of the ferroelectric memory.

Also, since the method comprises the step of forming the second insulating hydrogen barrier film so as to cover the common upper electrode, even when annealing in a hydrogen atmosphere is performed after forming the ferroelectric capacitors, hydrogen invasion of the capacitor dielectric film of the ferroelectric capacitors in a downward direction can be prevented. Thus, the ferroelectric film used for forming the capacitor dielectric film can be prevented from being reduced.

In the method for fabricating a ferroelectric memory, the second insulating hydrogen barrier film is preferably formed separately with respect to every capacitor line including some ferroelectric capacitors arranged along the one direction.

Thus, there is also no need to pattern the second insulating hydrogen barrier film in a region between the lower electrodes of the plural ferroelectric capacitors arranged in the one direction, and hence there is no need to secure a dimensional margin between the lower electrodes in consideration of the shift of a mask used for patterning. Accordingly, the intervals between the ferroelectric capacitors can be reduced, so as to reduce the area of the memory cell, namely, the area of the ferroelectric memory.

In the method for fabricating a ferroelectric memory, the second insulating hydrogen barrier film is preferably formed to cover a pair of capacitor lines adjacent to each other along the other direction out of the word line direction and the bit line direction among capacitor lines each including some ferroelectric capacitors arranged along the one direction.

Thus, there is no need to secure a dimensional margin between the pair of capacitor lines each including the plural ferroelectric capacitors arranged in the one direction. Therefore, the interval between the pair of capacitor lines can be reduced, so as to reduce the area of the memory cell array, namely, the area of the ferroelectric memory. Also, since there is a region where no hydrogen barrier film is formed in the vicinity of a selecting transistor of the ferroelectric memory, it is possible to secure a path for hydrogen to diffuse into the selecting transistor during annealing performed in a hydrogen atmosphere for recovering the characteristic of the transistor after forming metal wires.

The method for fabricating a ferroelectric memory of this invention preferably further comprises, before the step of forming the lower electrodes, a step of forming a conducting hydrogen barrier film between a contact plug formed in the interlayer insulating film and the lower electrodes.

Thus, in the case where annealing in a hydrogen atmosphere is performed after forming the ferroelectric capacitors, hydrogen invasion of the capacitor dielectric film of the ferroelectric capacitors in an upward direction can be prevented. Therefore, the ferroelectric film used for forming the capacitor dielectric film can be prevented from being reduced.

In the case where the method for fabricating a ferroelectric memory of this invention comprises the step of forming a conducting hydrogen barrier film, every capacitor line including some ferroelectric capacitors arranged along the one direction is preferably completely covered with the conducting hydrogen barrier film, the first insulating hydrogen barrier film and the second insulating hydrogen barrier film.

Thus, even when annealing is performed in a hydrogen atmosphere after forming the ferroelectric capacitors, the hydrogen invasion of the capacitor dielectric film of the ferroelectric capacitors can be definitely prevented. Accordingly, the ferroelectric film used for forming the capacitor dielectric film can be prevented from being reduced, resulting in definitely preventing degradation of the characteristic of the capacitor dielectric film.

The method for fabricating a ferroelectric memory of this invention preferably further comprises, between the step of forming the upper electrode and the step of forming a second insulating hydrogen barrier film, a step of forming, between the common upper electrode and the second insulating hydrogen barrier film, a level reducing film for reducing a level difference caused in a peripheral portion of the common upper electrode.

Thus, an angular level difference caused in the peripheral portion of the patterned upper electrode can be reduced, so as to improve coverage of the second insulating hydrogen barrier film at the peripheral portion of the upper electrode.

In the method for fabricating a ferroelectric memory, the first insulating hydrogen barrier film can be made from a $Si_3N_4$ film, a SiON film, an $Al_2O_3$ film, a $TiO_2$ film or an oxide or oxide nitrided film of an alloy of Ti and Al.

In the method for fabricating a ferroelectric memory, the second insulating hydrogen barrier film can be made from a $Si_3N_4$ film, a SiON film, an $Al_2O_3$ film, a $TiO_2$ film, a TiN film, an alloy film of Ti and Al, or an oxide, nitride or oxide nitrided film of an alloy of Ti and Al.

In the method for fabricating a ferroelectric memory, the conducting hydrogen barrier film can be made from an alloy film of Ti and Al, a nitride or oxide nitrided film of an alloy of Ti and Al, or a TiN film.

DETAILED DESCRIPTION OF THE INVENTION

The structure of a ferroelectric memory according to a preferred embodiment of the invention will now be described with reference to FIGS. 1 and 2.

The ferroelectric memory of this embodiment has a memory cell array including a plurality of memory cells arranged in a matrix shape along a word line direction and a bit line direction. FIG. 1 shows the cross-sectional structure of the ferroelectric memory taken along a plane parallel to a word line and FIG. 2 shows the cross-sectional structure thereof taken along a plane parallel to a bit line.

Figure 1:
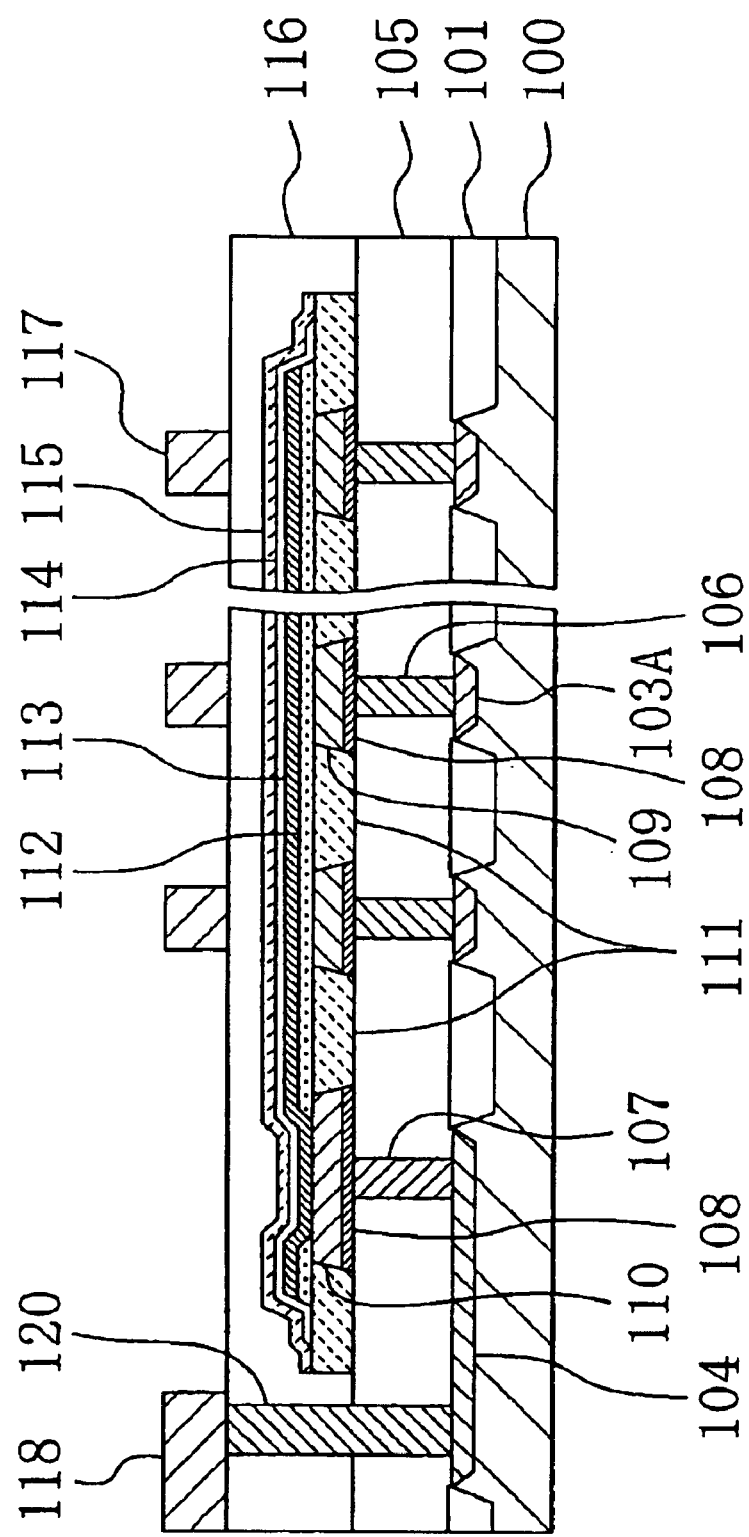
FIG. 1 is a cross-sectional view taken along a word line direction of a ferroelectric memory according to an embodiment of the invention.
Figure 2:
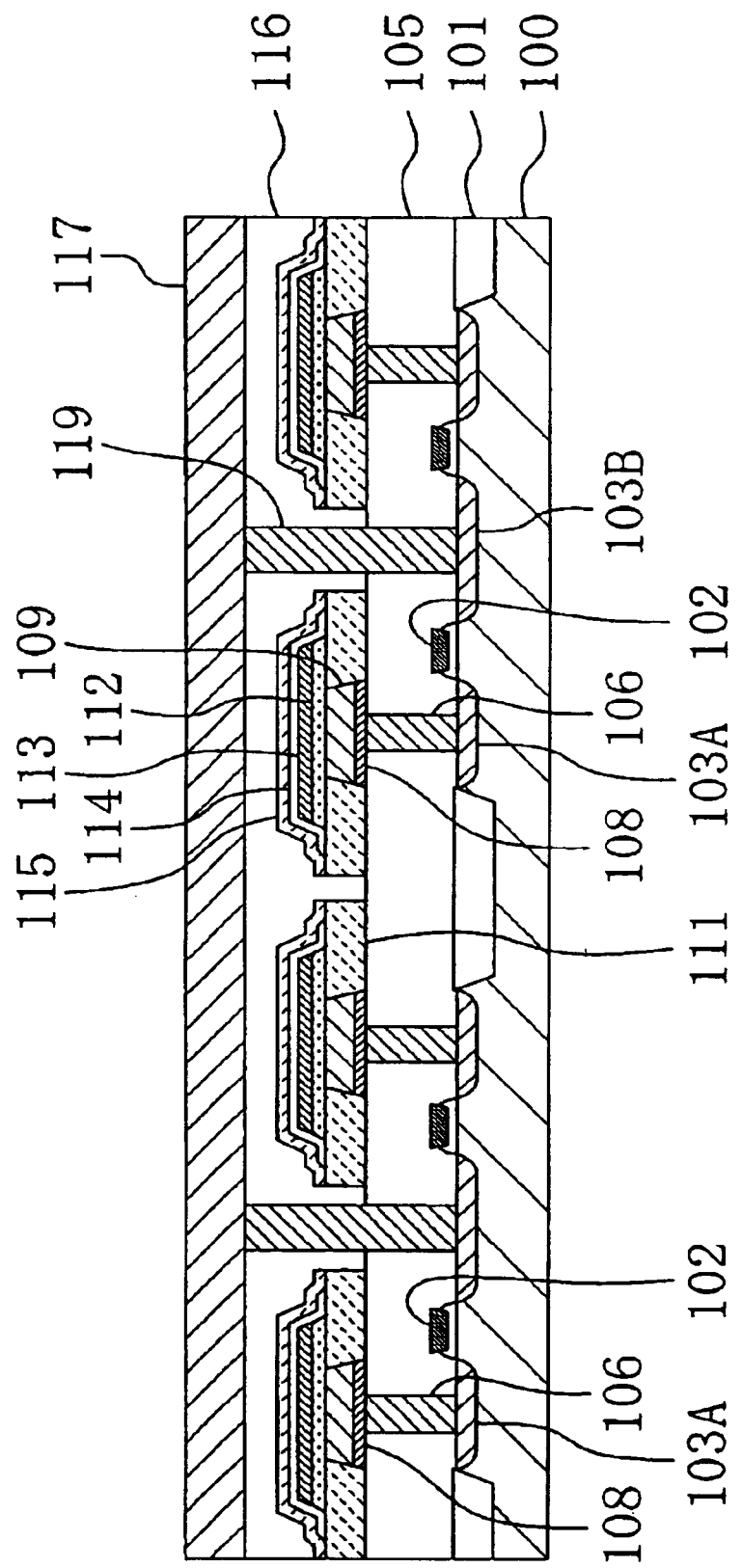
FIG. 2 is a cross-sectional view taken along a bit line direction of the ferroelectric memory according to the embodiment of the invention.

As shown in FIGS. 1 and 2, an isolation region 101 is formed in a surface portion of a semiconductor substrate 100 of silicon, and a gate electrode 102 is formed on the semiconductor substrate 100 with a gate insulating film sandwiched therebetween in a portion surrounded with the isolation region 101. First high concentration impurity diffusion layers 103A and 103B serving as a source and a drain are formed in surface portions of the semiconductor substrate 100 on both sides of the gate electrode 102. The gate electrode 102 and the first high concentration impurity diffusion layers 103A and 103B together form a field effect transistor. A second high concentration impurity diffusion layer 104 is formed in a surface portion of the semiconductor substrate 100 in a peripheral portion around the memory cell array.

A first interlayer insulating film 105 is formed on the semiconductor substrate 100 so as to cover the field effect transistor. A first contact plug 106 and a second contact plug 107 are buried in the first interlayer insulating film 105 with the lower end of the first contact plug 106 connected to the first high concentration impurity diffusion layer 103A and the lower end of the second contact plug 107 connected to the second high concentration impurity diffusion layer 104.

A conducting hydrogen barrier film 108 is formed on the first interlayer insulating film 105 so as to be connected to the upper end of the first contact plug 106 or the second contact plug 107. A lower electrode 109 is formed on the conducting hydrogen barrier film 108 in a position above the first contact plug 106, and an upper electrode relay portion 110 is formed on the conducting hydrogen barrier film 108 in a position above the second contact plug 107.

A first insulating hydrogen barrier film 111 is formed on the first interlayer insulating film 105 so as to surround the lower electrode 109 and the upper electrode relay portion 110, so that the top faces of the lower electrode 109, the upper electrode relay portion 110 and the first insulating hydrogen barrier film 111 can be placed at substantially the same level. In this embodiment, the first insulating hydrogen barrier film 111 is filled without leaving any space between the lower electrodes 109 arranged along the word line direction as shown in FIG. 1 but there is a space in the first insulating hydrogen barrier film 111 formed between the adjacent lower electrodes 109 arranged along the bit line direction as shown in FIG. 2.

A capacitor dielectric film 112 made from a ferroelectric film and commonly used by ferroelectric capacitors arranged in the word line direction is formed on the lower electrodes 109 arranged in the word line direction and on the first insulating hydrogen barrier film 111, and an opening is formed in the capacitor dielectric film 112 above the upper electrode relay portion 110. An upper electrode 113 commonly used by the ferroelectric capacitors arranged along the word line direction is formed on the capacitor dielectric film 112, and the upper electrode 113 is connected to the upper electrode relay portion 110 through the opening formed in the capacitor dielectric film. The lower electrode 109, the capacitor dielectric film 112 and the upper electrode 113 described above together form a ferroelectric capacitor, and the capacitor dielectric film 112 and the upper electrode 113 are commonly provided to every capacitor line including a plurality of ferroelectric capacitors arranged along the word line direction.

A second insulating hydrogen barrier film 115 is formed on the upper electrode 113 with a level reducing film 114 sandwiched therebetween, and the peripheral portion of the second insulating hydrogen barrier film 115 is connected to the top face of the first insulating hydrogen barrier film 111. Accordingly, every capacitor line including a plurality of ferroelectric capacitors arranged along the word line direction is completely covered with the conducting hydrogen barrier film 108, the first insulating hydrogen barrier film 111 and the second insulating hydrogen barrier film 115.

A second interlayer insulating film 116 is formed on the first interlayer insulating film 105 so as to cover the second insulating hydrogen barrier film 115, and a first metal wire 117 and a second metal wire 118 are formed on the second interlayer insulating film 116. The first metal wire 117 and the first high concentration impurity diffusion layer 103B are connected to each other through a third contact plug 119 buried in the first interlayer insulating film 105 and the second interlayer insulating film 116, and the second metal wire 118 and the second high concentration impurity diffusion layer 104 are connected to each other through a fourth contact plug 120 buried in the first interlayer insulating film 105 and the second interlayer insulting film 116.

In the ferroelectric memory of this embodiment, the first insulating hydrogen barrier film 111 is filled between the lower electrodes 109 of the plural ferroelectric capacitors arranged along the word line direction. Therefore, there is no need to pattern the first insulating hydrogen barrier film 111 in regions between the lower electrodes 109 of the plural ferroelectric capacitors arranged along the word line direction. Accordingly, there is no need to secure a dimensional margin between the lower electrodes 109 in consideration of the shift of a mask used for the patterning, and hence, the intervals between the ferroelectric capacitors can be reduced so as to reduce the area of the memory cell array.

Also, every capacitor line including the plural ferroelectric capacitors arranged along the word line direction is completely covered with the conducting hydrogen barrier film 108, the first insulating hydrogen barrier film 111 and the second insulating hydrogen barrier film 115. Therefore, even when annealing is performed in a hydrogen atmosphere after forming the ferroelectric capacitors, the hydrogen invasion of the capacitor dielectric film 112 of the ferroelectric capacitors can be definitely prevented. Accordingly, the reduction of the ferroelectric film used for forming the capacitor dielectric film 112 can be prevented, so as to prevent degradation of the characteristic of the capacitor dielectric film 112.

Figure 3:
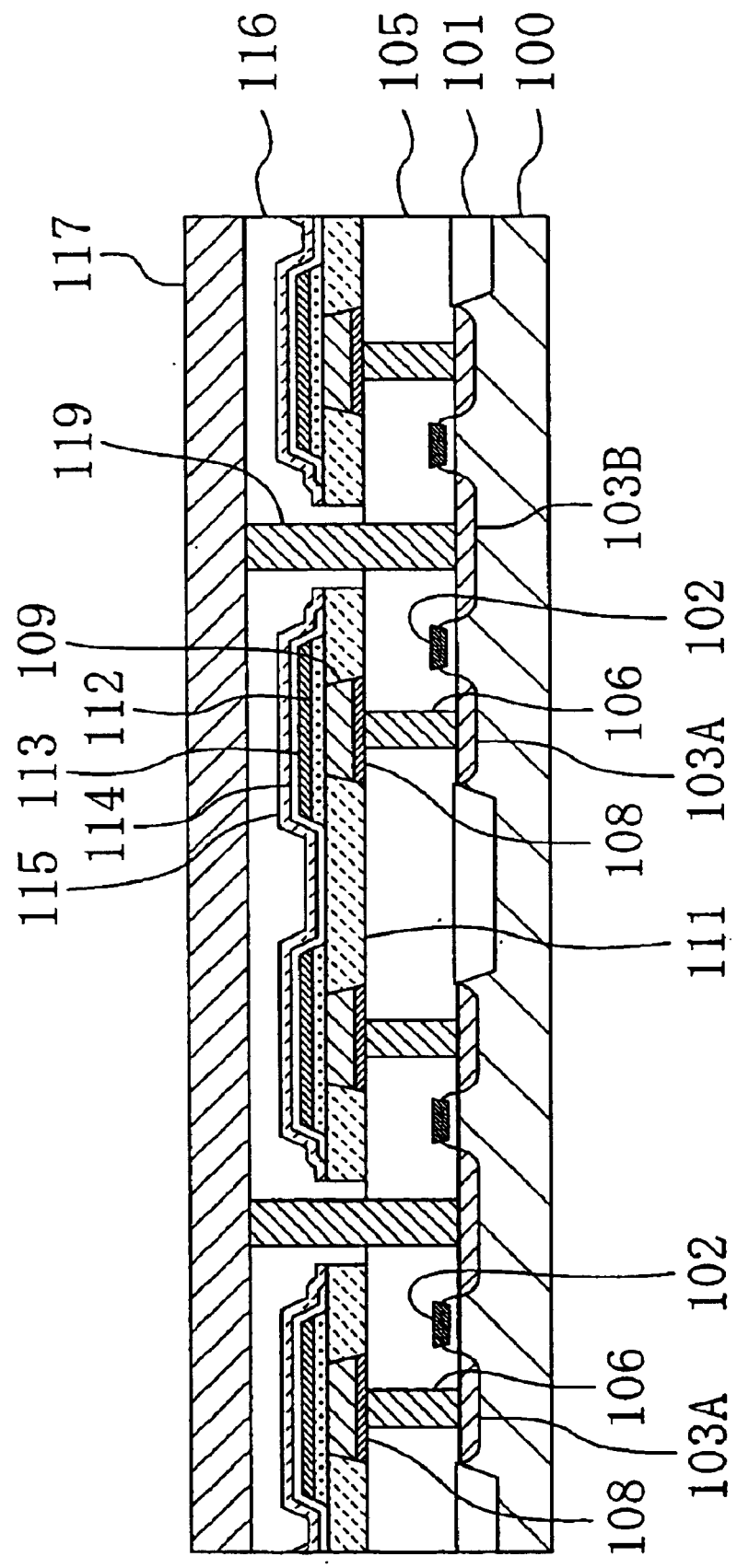
FIG. 3 is a cross-sectional view taken along a bit line direction of a ferroelectric memory according to a modification of the embodiment of the invention.

Now, a ferroelectric memory according to a modification of this embodiment will be described with reference to FIG. 3. In this modification, like reference numerals are used to refer to like elements used in the embodiment, and the description is omitted.

In the above-described embodiment of the invention, there are spaces between the capacitor lines each including the ferroelectric capacitors arranged along the word line direction and the spaces are filled with the second interlayer insulating film 116 as shown in FIG. 2. In contrast, in this modification, there is no space between a pair of capacitor lines adjacent to each other along the bit line direction without sandwiching the third contact plug 119, and the first insulating hydrogen barrier film 111, the level reducing film 114 and the second insulating hydrogen barrier film 115 are continuous in a region between this pair of capacitor lines as shown in FIG. 3.

In the ferroelectric memory according to the modification of this embodiment, there is no need to pattern the first insulating hydrogen barrier film 111 also in a region between the lower electrodes 109 of the ferroelectric capacitors adjacent to each other along the bit line direction. Therefore, the intervals between the lower electrodes 109 adjacent to each other along the bit line direction can be also reduced, so as to further reduce the area of the memory cell array.

Also, since there is a region where no hydrogen barrier film is formed in the vicinity of the selecting transistor of the ferroelectric memory, it is possible to secure a path for allowing hydrogen to diffuse into the selecting transistor during annealing performed in a hydrogen atmosphere for recovering the characteristic of the transistor after forming the metal wires. In particular in a stack type ferroelectric memory in which ferroelectric capacitors are formed above transistors, a path for allowing hydrogen to diffuse into the selecting transistor can be provided in the vicinity of the area where the transistor is formed. Accordingly, in the annealing performed in a hydrogen atmosphere for recovering the characteristic of the transistor after forming the metal wires, the path for allowing hydrogen to diffuse into the selecting transistor can be definitely secured, so that the characteristic of the transistor can be definitely secured.

Now, a method for fabricating the ferroelectric memory of this embodiment will be described with reference to FIGS. 4A through 4C and 5A through 5C.

Figure 4A:
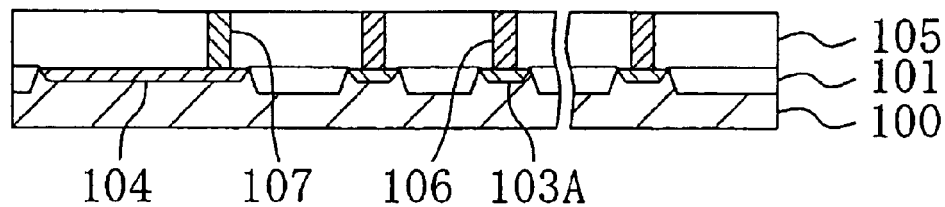
FIGS. 4A, 4B and 4C are cross-sectional views for showing procedures in a method for fabricating a ferroelectric memory according to the embodiment of the invention.

First, as shown in FIG. 4A, an isolation region 101 is formed in a surface portion of a semiconductor substrate 100 of silicon by known STI (Shallow Trench Isolation) technique or the like. Then, a gate electrode 102 (shown in FIG. 2) is formed by known CMOS process on the semiconductor substrate 100 with a gate insulating film sandwiched therebetween in a portion surrounded with the isolation region 101. Thereafter, first high concentration impurity diffusion layers 103A and 103B serving as a source and a drain are formed in surface portions of the semiconductor substrate 100 on the both sides of the gate electrode 102, and a second high concentration impurity diffusion layer 104 is formed in a surface portion of the semiconductor substrate 100 in a peripheral portion of a memory cell array. Thus, a field effect transistor including the gate electrode 102 and the first high concentration impurity diffusion layers 103A and 103B is formed.

Next, a first interlayer insulating film 105 of a BPSG film is formed on the semiconductor substrate 100 so as to cover the field effect transistor. Then, a first contact hole whose lower end is connected to the first high concentration impurity diffusion layer 103A and a second contact hole whose lower end is connected to the second high concentration impurity diffusion layer 104 are formed in the first interlayer insulating film 105. Thereafter, a titanium film with a thickness of 10 nm formed by sputtering and a titanium nitride film with a thickness of 10 nm formed by CVD are successively deposited on the walls and the bottoms of the first and second contact holes. Then, a tungsten film is deposited by the CVD within the first and second contact holes and over the first interlayer insulating film 105. Subsequently, a portion of the tungsten film exposed on the first interlayer insulating film 105 is polished back by CMP, thereby forming a first contact plug 106 and a second contact plug 107.

Figure 4B:
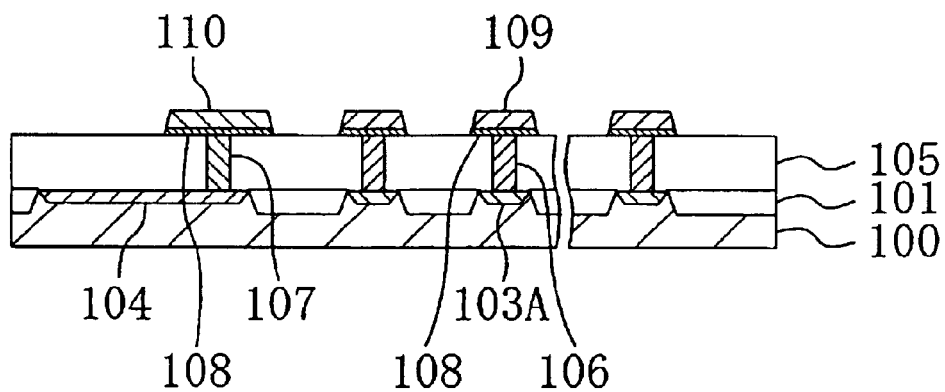

Next, a nitride film of an alloy of Ti and Al with a thickness of, for example, 40 nm is deposited on the first interlayer insulating film 105 by the sputtering, and a multilayer film consisting of, for example, an Ir film with a thickness of 100 nm, an $IrO_2$ film with a thickness of 50 nm and a Pt film with a thickness of 100 nm is deposited on the nitride film by the sputtering. Thereafter, the multilayer film and the nitride film are patterned, so as to form a conducting hydrogen barrier film 108 made from the nitride film of the alloy of Ti and Al, and lower electrodes 109 and an upper electrode relay portion 110 made from the multilayer film of the Ir film, the $IrO_2$ film and the Pt film as shown in FIG. 4B. The conducting hydrogen barrier film 108 may be made from an alloy film of Ti and Al, an oxide nitrided film of an alloy of Ti and Al or a TiN film instead of the nitride film of the alloy of Ti and Al.

Figure 4C:
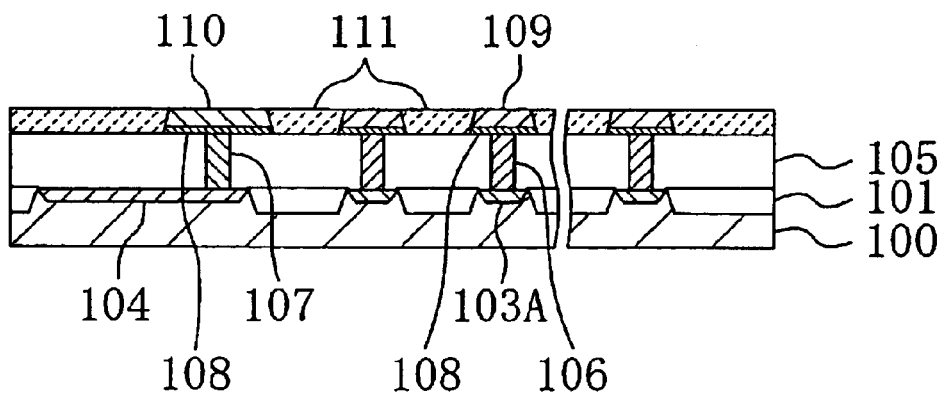

Next, a $Si_3N_4$ film with a thickness of 400 nm is deposited by the CVD over the lower electrodes 109, the upper electrode relay portion 110 and the first interlayer insulating film 105, and the $Si_3N_4$ film is planarized by the CMP. Thus, as shown in FIG. 4C, a first insulating hydrogen barrier film 111 is filled between the lower electrodes 109 and between the lower electrode 109 and the upper electrode relay portion 110, and the top face of the first insulating hydrogen barrier film 111 is placed at substantially the same level as the top faces of the lower electrodes 109 and the upper electrode relay portion 110. The first insulating hydrogen barrier film 111 may be made from a SiON film, an $Al_2O_3$ film, a $TiO_2$ film, or an oxide or oxide nitrided film of an alloy of Ti and Al instead of the $Si_3N_4$ film.

Figure 5A:
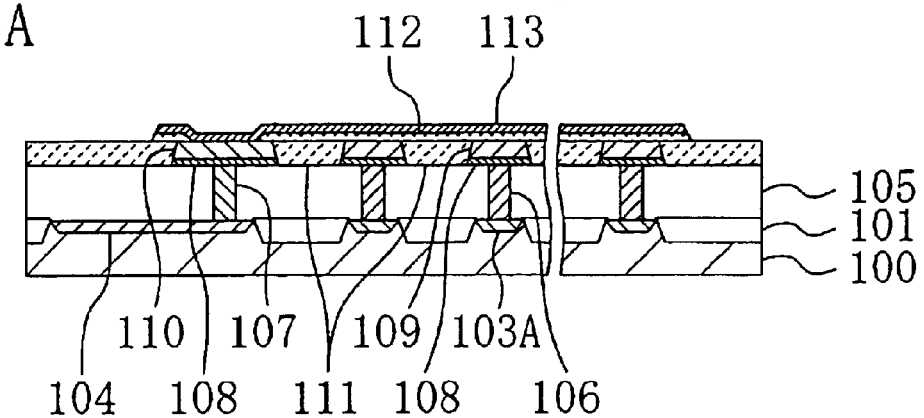
FIGS. 5A, 5B and 5C are cross-sectional views for showing other procedures in the method for fabricating a ferroelectric memory according to the embodiment of the invention.

Next, as shown in FIG. 5A, a ferroelectric film of, for example, a SBT film with a thickness of 100 nm is deposited by spin coating on the lower electrodes 109, the upper electrode relay portion 110 and the first insulating hydrogen barrier film 111, and the ferroelectric film is patterned, so as to form a capacitor dielectric film 112 that is commonly formed on the lower electrodes 109 arranged along the word line direction and on the first insulating hydrogen barrier film 111 and has an opening above the upper electrode relay portion 110. Thereafter, a Pt film with a thickness of 100 nm is deposited by the sputtering on the capacitor dielectric film 112, and the Pt film is patterned, so as to form an upper electrode 113 on the capacitor dielectric film 112. Thus, a capacitor line in which ferroelectric capacitors each including the lower electrode 109, the capacitor dielectric film 112 and the upper electrode 113 are arranged along the word line direction is formed, and the capacitor-dielectric film 112 and the upper electrode 113 are commonly provided on the capacitor line.

Figure 5B:
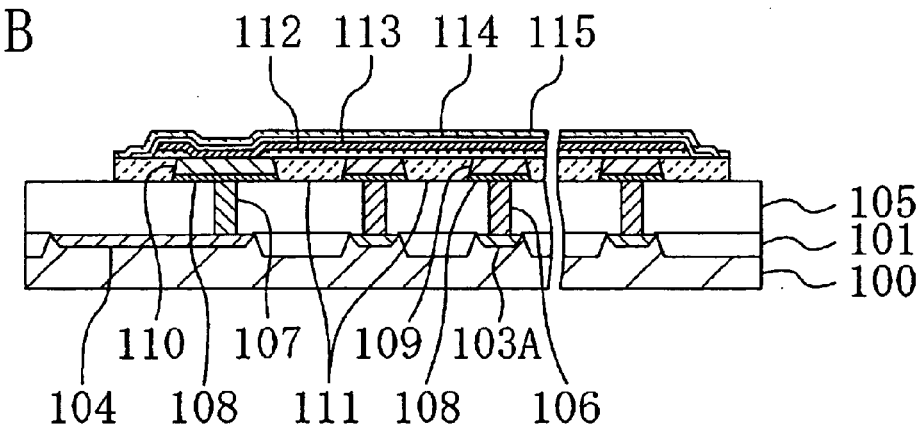

Next, as shown in FIG. 5B, an NSG film with a thickness of 150 nm is deposited over the upper electrode 113 and the first insulating hydrogen barrier film 111. The NSG film is patterned so as to completely cover every capacitor line including the ferroelectric capacitors arranged along the word line direction and the upper electrode relay portion 110 disposed at the end of the capacitor line. Thus, a level reducing film 114 of the NSG film is formed.

Then, a second insulating hydrogen barrier film 115 with a thickness of 100 nm is deposited over the level reducing film 114 and the first insulating hydrogen barrier film 111. The second insulating hydrogen barrier film 115 and the first insulating hydrogen barrier film 111 are patterned, so as to cover every capacitor line including the ferroelectric capacitors arranged along the word line direction and the upper electrode relay portion 110 disposed at the end of the capacitor line. Thus, since the patterned second insulating hydrogen barrier film 115 and the patterned first insulating hydrogen barrier film 111 are connected to each other at the peripheral portions thereof, every capacitor line including the ferroelectric capacitors arranged along the word line direction is completely covered with the conducting hydrogen barrier film 108, the first insulating hydrogen barrier film 111 and the second insulating hydrogen barrier film 115.

The second insulating hydrogen barrier film 115 may be made from any film capable of preventing hydrogen invasion, such as a $Si_3N_4$ film, a SiON film, an $Al_2O_3$ film, a $TiO_2$ film, a TiN film, an alloy film of Ti and Al, and an oxide, nitride or oxide nitrided film of an alloy of Ti and Al.

The level reducing film 114 is formed for reducing an angular level difference caused at the periphery of the capacitor dielectric film 112 and the upper electrode 113 formed through the patterning, so as to improve the coverage of the second insulating hydrogen barrier film 115 at the periphery of the capacitor dielectric film 112 and the upper electrode 113.

Accordingly, when the second insulating hydrogen barrier film 115 is made from a film with good coverage, such as a SiN film, a SiON film, an $Al_2O_3$ film, a $TiO_2$ film or an oxide film of an alloy of Ti and Al, the level reducing film 114 can be omitted.

Figure 5C:
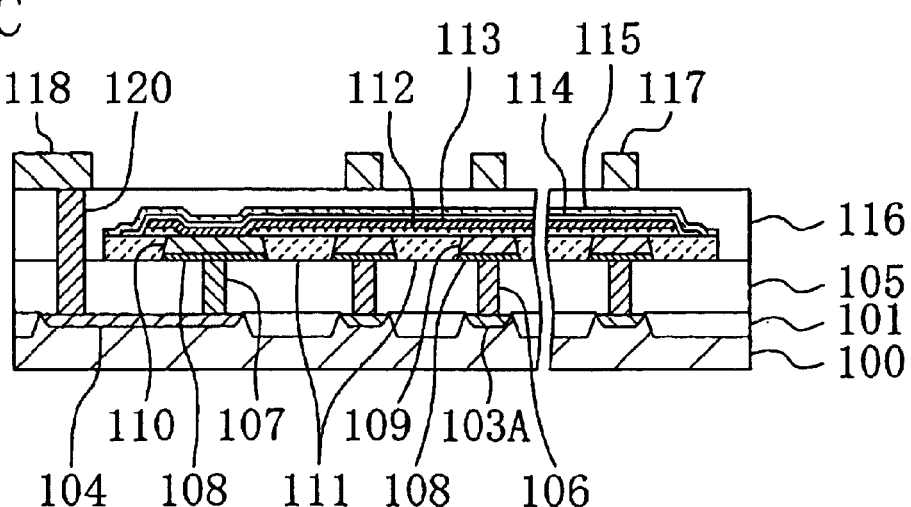
Figure 6:
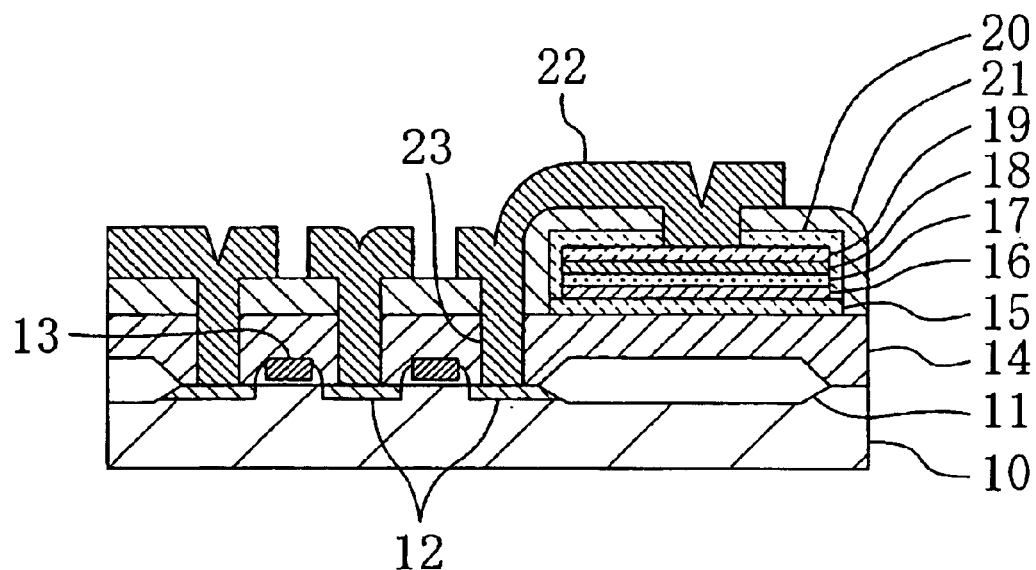
FIG. 6 is a cross-sectional view of a conventional ferroelectric memory.

Next, as shown in FIG. 5C, a second interlayer insulating film 116 of an NSG film is deposited on the first interlayer insulating film 105 so as to cover the patterned second insulating hydrogen barrier film 115, and the second interlayer insulating film 116 is planarized.

Then, a third contact hole connected to the first high concentration impurity diffusion layer 103B (shown in FIG. 2) and a fourth contact hole connected to the second high concentration impurity diffusion layer 104 are formed in the first interlayer insulating film 105 and the second interlayer insulating film 116. Thereafter, a tungsten film is filled in the third contact hole and the fourth contact hole, so as to form a third contact plug 119 and a fourth contact plug 120 (shown in FIG. 2).

Subsequently, an Al alloy film is deposited on the second interlayer insulating film 116, and the Al alloy film is patterned into a first metal wire 117 and a second metal wire 118. In this manner, the ferroelectric memory according to the embodiment of the invention is obtained.

In this embodiment, the first insulating hydrogen barrier film 111 is filled between the lower electrodes 109 of the plural ferroelectric capacitors arranged along the word line direction among the plural ferroelectric capacitors included in the memory cell array; the capacitor dielectric film 112 commonly used by the plural ferroelectric capacitors arranged along the word line direction is formed on the lower electrodes 109 of the plural ferroelectric capacitors arranged along the word line direction and on the first insulating hydrogen barrier film 111; the upper electrode 113 commonly used by the plural ferroelectric capacitors arranged along the word line direction is formed on the common capacitor dielectric film 112; and the second insulating hydrogen barrier film 115 is formed so as to cover the common upper electrode 113. Instead, the following structure may be employed: The first insulating hydrogen barrier film 111 is filled between the lower electrodes 109 of a plurality of ferroelectric capacitors arranged along the bit line direction among the plural ferroelectric capacitors included in the memory cell array; the capacitor dielectric film 112 commonly used by the plural ferroelectric capacitors arranged along the bit line direction is formed on the lower electrodes 109 of the plural ferroelectric capacitors arranged along the bit line direction and on the first insulating hydrogen barrier film 111; the upper electrode 113 commonly used by the plural ferroelectric capacitors arranged along the bit line direction is formed on the common capacitor dielectric film 112; and the second insulating hydrogen barrier film 115 is formed so as to cover the common upper electrode 113.

What is claimed is:

1. A method for fabricating a ferroelectric memory including a plurality of ferroelectric capacitors, each of which has a lower electrode, a capacitor dielectric film of a ferroelectric film and an upper electrode successively formed on an interlayer insulating film on a semiconductor substrate, said plurality of ferroelectric capacitors being arranged along a bit line direction and a word line direction, comprising the steps of:

forming said lower electrodes of said plurality of ferroelectric capacitors on said interlayer insulating film;

depositing a first insulating hydrogen barrier film on said interlayer insulating film and said lower electrodes and planarizing said first insulating hydrogen barrier film, whereby filling said first insulating hydrogen barrier film between said lower electrodes of some ferroelectric capacitors, among said plurality of ferroelectric capacitors, that are arranged along one direction out of said word line direction and said bit line direction;

forming, on said lower electrodes of said some ferroelectric capacitors arranged along said one direction and on said first insulating hydrogen barrier film, said capacitor dielectric film as a common capacitor dielectric film commonly used by said some ferroelectric capacitors arranged along said one direction;

forming, on said common capacitor dielectric film, said upper electrode as a common upper electrode commonly used by said some ferroelectric capacitors arranged along said one direction; and forming, on said common upper electrode, a second insulating hydrogen barrier film covering said common upper electrode.

2. The method for fabricating a ferroelectric memory of claim 1, wherein said second insulating hydrogen barrier film is formed separately with respect to every capacitor line including some ferroelectric capacitors arranged along said one direction.

3. The method for fabricating a ferroelectric memory of claim 1, wherein said second insulating hydrogen barrier film is formed to cover a pair of capacitor lines adjacent to each other along the other direction out of said word line direction and said bit line direction among capacitor lines each including some ferroelectric capacitors arranged along said one direction.

4. The method for fabricating a ferroelectric memory of claim 1, further comprising, before the step of forming said lower electrodes, a step of forming a conducting hydrogen barrier film between a contact plug formed in said interlayer insulating film and said lower electrodes.

5. The method for fabricating a ferroelectric memory of claim 4, wherein every capacitor line including some ferroelectric capacitors arranged along said one direction is completely covered with said conducting hydrogen barrier film, said first insulating hydrogen barrier film and said second insulating hydrogen barrier film.

6. The method for fabricating a ferroelectric memory of claim 1, further comprising, between the step of forming said upper electrode and the step of forming a second insulating hydrogen barrier film, a step of forming, between said common upper electrode and said second insulating hydrogen barrier film, a level reducing film for reducing a level difference caused in a peripheral portion of said common upper electrode.

7. The method for fabricating a ferroelectric memory of claim 1, wherein said first insulating hydrogen barrier film is made from a $Si_3N_4$ film, a SiON film, an $Al_2O_3$ film, a $TiO_2$ film or an oxide or oxide nitrided film of an alloy of Ti and Al.

8. The method for fabricating a ferroelectric memory of claim 1, wherein said second insulating hydrogen barrier film is made from a $Si_3N_4$ film, a SiON film, an $Al_2O_3$ film, a $TiO_2$ film, a TiN film, an alloy film of Ti and Al, or an oxide, nitride or oxide nitrided film of an alloy of Ti and Al.

9. The method for fabricating a ferroelectric memory of claim 4, wherein said conducting hydrogen barrier film is made from an alloy film of Ti and Al, a nitride or oxide nitrided film of an alloy of Ti and Al, or a TiN film.

* * * * *